US012701810B2

(12) United States Patent
Nakajima

(10) Patent No.: US 12,701,810 B2
(45) Date of Patent: Aug. 4, 2026

(54) SEMICONDUCTOR DEVICE AND METHOD OF MANUFACTURING SEMICONDUCTOR DEVICE

(71) Applicant: Kioxia Corporation, Tokyo (JP)

(72) Inventor: Akira Nakajima, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 417 days.

(21) Appl. No.: 18/334,547

(22) Filed: Jun. 14, 2023

(65) Prior Publication Data

US 2024/0006359 A1 Jan. 4, 2024

(30) Foreign Application Priority Data

Jul. 4, 2022 (JP) ................................. 2022-108003

(51) Int. Cl.
*H10F 39/00* (2025.01)
*H10W 72/00* (2026.01)
(Continued)

(52) U.S. Cl.
CPC ......... *H10F 39/811* (2025.01); *H10F 39/809* (2025.01); *H10W 72/019* (2026.01);
(Continued)

(58) Field of Classification Search
CPC ......... H01L 24/08; H01L 24/03; H01L 24/05; H01L 24/80; H01L 2224/0345; H01L 2224/03462; H01L 2224/03845; H01L 2224/03848; H01L 2224/05546; H01L 2224/05547; H01L 2224/05583; H01L 2224/05647; H01L 2224/05666; H01L 2224/05681; H01L 2224/05686; H01L 2224/08147; H01L 2224/08501; H01L 2224/80357; H01L 2224/808;
(Continued)

(56) References Cited

U.S. PATENT DOCUMENTS 9,941,243 B2 4/2018 Kim et al.
11,018,110 B2 5/2021 Hirata et al.
(Continued)

FOREIGN PATENT DOCUMENTS

JP 3109269 B2 11/2000
JP 2016174016 A 9/2016
(Continued)

*Primary Examiner* — Moin M Rahman
(74) *Attorney, Agent, or Firm* — Maier & Maier, PLLC

(57) ABSTRACT

In a semiconductor device according to an embodiment, a first connection wiring layer and a second connection wiring layer are bonded such that a first surface and a second surface face each other and a first electrode and a second electrode are in contact with each other, wherein the first electrode includes a first barrier metal film provided in a first trench and containing Ti, and a first conductive film provided in the first trench via the first barrier metal film and containing polycrystalline Cu, the second electrode includes a second barrier metal film provided in a second trench and containing Ti, and a second conductive film provided in the second trench via the second barrier metal film and containing polycrystalline Cu, and Ti and O are present on a bonding surface between the first electrode and the second electrode.

8 Claims, 13 Drawing Sheets

(51) Int. Cl.
| | |
|---|---|
| *H10W 72/90* | (2026.01) |
| *H10W 80/00* | (2026.01) |
| *H10W 90/00* | (2026.01) |

(52) U.S. Cl.
CPC *H10W 72/01935* (2026.01); *H10W 72/01938* (2026.01); *H10W 72/01951* (2026.01); *H10W 72/071* (2026.01); *H10W 72/921* (2026.01); *H10W 72/923* (2026.01); *H10W 72/941* (2026.01); *H10W 72/952* (2026.01); *H10W 72/953* (2026.01); *H10W 80/754* (2026.01); *H10W 90/792* (2026.01)

(58) Field of Classification Search
CPC ... H01L 2924/0132; H01L 2924/05341; H01L 2924/0541; H01L 2924/1431; H01L 23/528; H01L 21/76831; H01L 21/76877; H01L 21/76883; H01L 21/02164; H01L 21/76816; H01L 21/7684; H01L 21/76843; H01L 21/76846; H01L 21/76864; H01L 23/5283; H01L 23/53228; H01L 23/53238; H01L 21/288; H01L 21/76838; H01L 21/28026; H01L 21/823475; H01L 21/823871; H01L 23/552; H01L 25/16; H01L 27/14636; H01L 2224/19; H01L 2224/25; H01L 2225/06541; H01L 21/76807–76813; H01L 2221/1015–1036; H01L 21/768–76898; H01L 23/522–53295; H01L 2221/10–1094; H01L 23/535; H01L 23/53209; H01L 21/76895; H01L 21/76805; H01L 23/53257; H01L 23/53266; H01L 21/76849; H01L 21/7685; H10F 39/809; H10F 39/811; H10W 20/00–498; H10W 72/823; H10W 20/01–098; H10W 20/20–233; H10W 20/021–0265; H10W 20/40–498; H10W 90/00; H10W 72/01365; H10W 72/07331; H10W 72/07332; H10W 72/07354; H10W 72/07355; H10W 72/344; H10W 72/351; H10W 72/353; H10W 72/90; H10W 72/923; H10W 72/952; H10W 72/967; H10W 90/732; H10W 72/0198; H10W 72/019; H10W 72/921; H10W 72/934; H10W 72/941; H10W 80/301; H10W 80/312; H10W 80/327; H10W 80/333; H10W 80/701; H10W 80/732; H10W 80/754; H10W 90/24; H10W 90/28; H10W 90/297; H10W 90/792; H10W 20/484; H10W 72/01935; H10W 72/01938; H10W 72/01951; H10W 72/071; H10W 72/953; H10W 99/00; H10W 20/056; H10W 20/076; H10W 20/43; H10W 72/00; H10W 95/00; H10W 72/01953; H10W 72/924; H10W 72/9415; H10W 72/942; H10W 80/011; H10W 80/016; H10W 80/033; H10W 80/035; H10W 80/037; H10W 80/102; H10W 80/743; H10W 90/722; H10W 72/926; H10W 72/013; H10W 72/30; H10W 72/073; H10W 72/07311; H10W 72/325; H10W 72/328; H10W 72/337; H10W 72/357; H10P 90/1914; H10P 10/128
See application file for complete search history.

(56) References Cited

U.S. PATENT DOCUMENTS

| | | | |
|---|---|---|---|
| 11,355,441 B2 | 6/2022 | Nomura et al. | |
| 2010/0096756 A1* | 4/2010 | Tagami | H01L 21/76873 |
| | | | 438/650 |
| 2017/0062366 A1 | 3/2017 | Enquist | |
| 2021/0265293 A1* | 8/2021 | Tagami | H10W 90/00 |
| 2022/0189905 A1* | 6/2022 | Sawada | H01L 24/83 |

FOREIGN PATENT DOCUMENTS

| | | |
|---|---|---|
| JP | 2017135247 A | 8/2017 |
| JP | 2018073851 A | 5/2018 |
| JP | 2018073967 A | 5/2018 |
| JP | 6952629 B2 | 10/2021 |

* cited by examiner

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2022-108003, filed on Jul. 4, 2022, the entire contents of which are incorporated herein by reference.

FIELD

The present embodiment relates to a semiconductor device and a method of manufacturing the semiconductor device.

BACKGROUND

Conventionally, there is a technique for reducing the area occupied by a semiconductor device by bonding substrates on which semiconductor elements and integrated circuits are formed to form a laminated structure. Electrodes for electrically connecting the substrates are provided at corresponding positions on each bonding surface of the substrates to be bonded. Each substrate to be bonded is bonded after being polished so that the bonding surface becomes flat.

However, after the step of polishing the bonding surfaces of the substrates, the resistance of the bonding portion of the wiring at the bonding interface between the substrates to be bonded increases, which may reduce the yield of the semiconductor device.

DETAILED DESCRIPTION

An object of one embodiment is to provide a semiconductor device and a method of manufacturing the semiconductor device, which can improve a yield by suppressing a connection failure of a wiring at an interface between the substrates to be bonded.

Means for Solving the Problem

A semiconductor device according to one embodiment includes: a first connection wiring layer configured to comprise a first insulating layer including a first trench formed on a first surface, and a first electrode provided in the first trench; and a second connection wiring layer configured to comprise a second insulating layer including a second trench formed on a second surface facing the first surface, and a second electrode provided in the second trench, wherein the first connection wiring layer and the second connection wiring layer are bonded such that the first surface and the second surface face each other and the first electrode and the second electrode are in contact with each other, wherein the first electrode includes a first barrier metal film provided in the first trench and containing Ti, and a first conductive film provided in the first trench via the first barrier metal film and containing polycrystalline Cu, wherein the second electrode includes a second barrier metal film provided in the second trench and containing Ti, and a second conductive film provided in the second trench via the second barrier metal film and containing polycrystalline Cu, and wherein Ti and O are present on the bonding surface between the first electrode and the second electrode.

A semiconductor device and a method of manufacturing the semiconductor device according to embodiments will be described in detail below with reference to the accompanying drawings. In addition, the present invention is not limited by these embodiments.

First Embodiment

Figure 1:
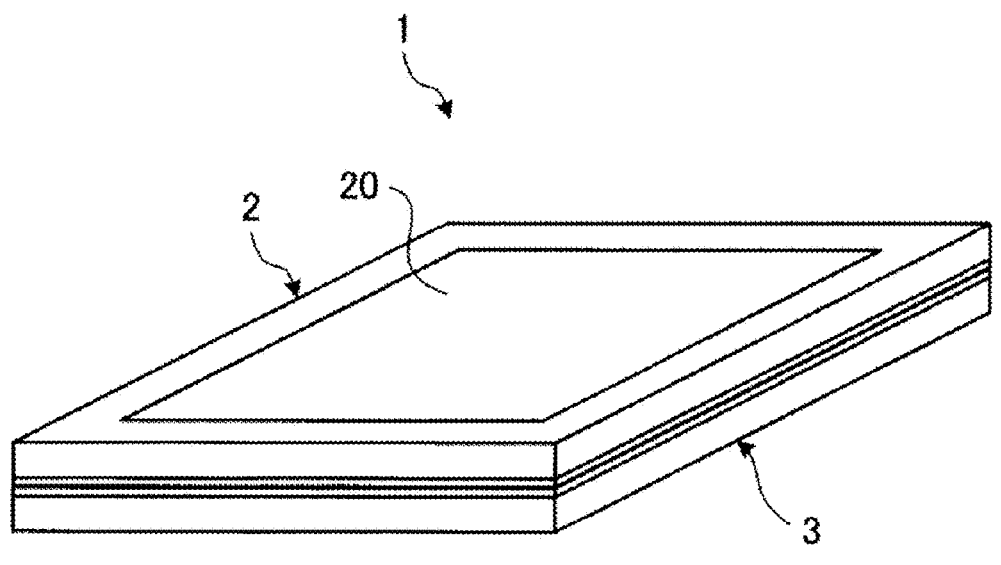
FIG. 1 is a perspective view showing a semiconductor device according to a first embodiment.
Figure 2:
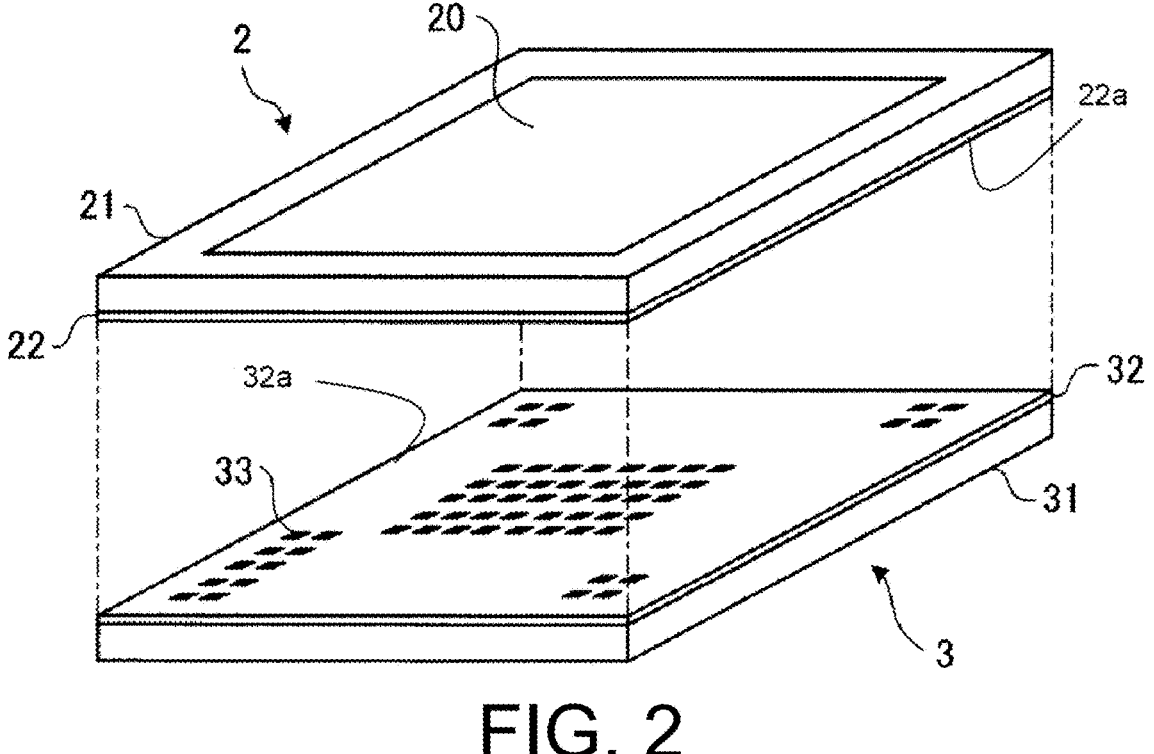
FIG. 2 is an exploded perspective view of the semiconductor device according to the first embodiment.
Figure 3:
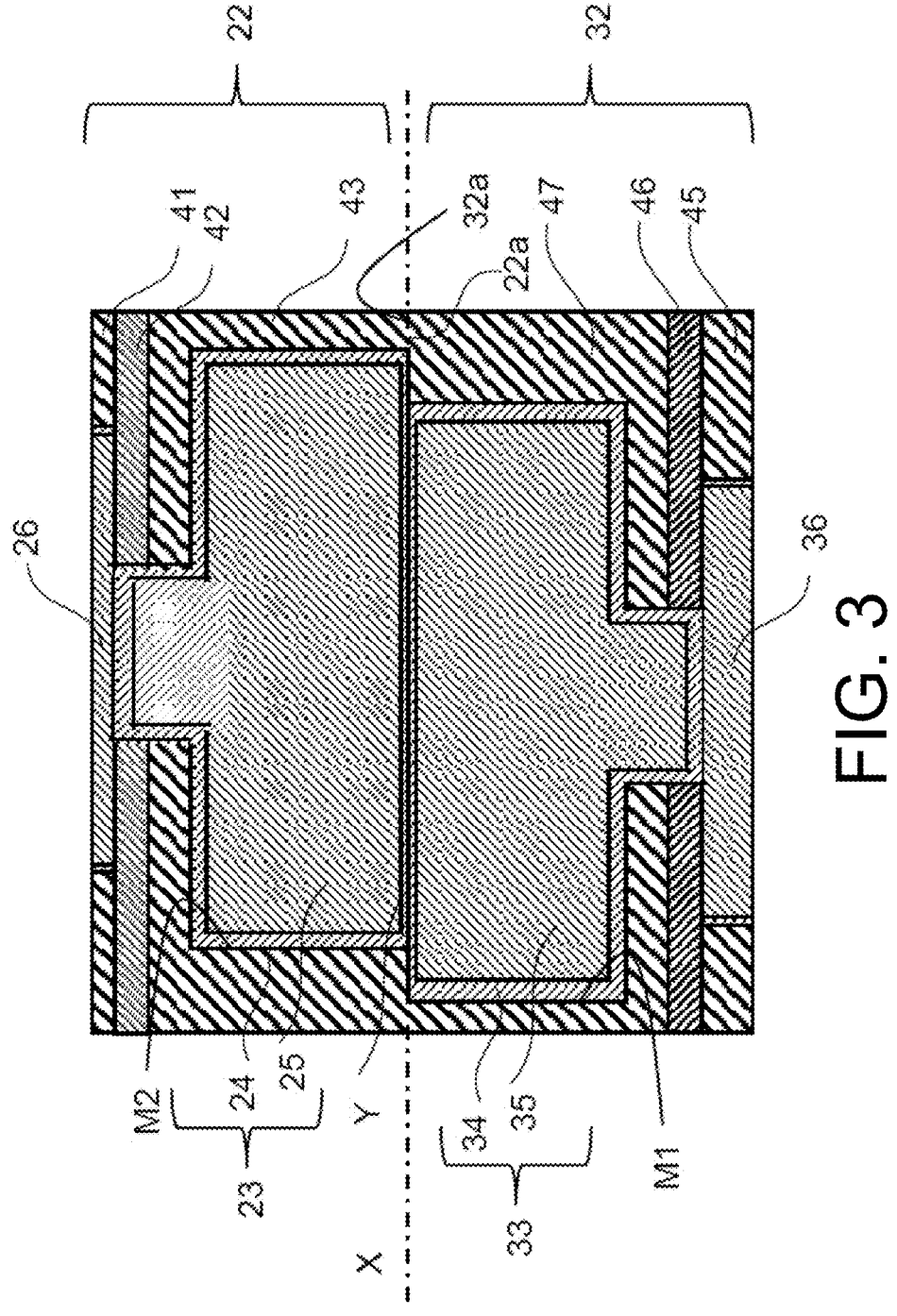
FIG. 3 is an explanatory diagram showing a cross-sectional structure of the semiconductor device according to the first embodiment.

FIG. 1 is a perspective view showing the semiconductor device according to a first embodiment. FIG. 2 is an exploded perspective view of the semiconductor device according to the first embodiment. FIG. 3 is an explanatory diagram showing a cross-sectional structure of the semiconductor device according to the first embodiment.

Semiconductor Device

For example, as shown in FIG. 1, the semiconductor device 1 includes a first substrate 3 and a second substrate 2 that are bonded together.

The first substrate 3 is, for example, a logic substrate that includes logic circuits that read image signals of captured images from the CMOS image sensor 20 and perform various signal processing on the image signals that are read.

Also, the second substrate 2 is, for example, a sensor substrate including a CMOS (Complementary Metal Oxide Semiconductor) image sensor 20 for imaging an object. The semiconductor device 1 may have a configuration in which a first logic substrate and a second logic substrate are bonded together, or may have a configuration in which the logic substrate and a memory substrate are bonded together. Also, the semiconductor device 1 may have a configuration in which three or more substrates are laminated.

Then, as shown in FIG. 2, the first substrate 3 includes a device layer 31 provided with a logic circuit and the like, and a first connection wiring layer 32 provided on the upper surface of the device layer 31 and including a plurality of metal electrodes (hereinafter simply referred to as "first electrode 33"). The first electrode 33 is embedded in the first connection wiring layer 32 with one end surface exposed from the first connection wiring layer 32, and is connected to, for example, a logic circuit or the like via wiring inside the device layer 31.

On the other hand, the second substrate 2 includes a device layer 21 on which a CMOS image sensor 20 and the like are provided, and a second connection wiring layer 22 provided on the lower surface of the device layer 21 and including a plurality of metal electrodes (hereinafter simply referred to as "electrode") embedded in positions corresponding to the first electrodes 33 of the first substrate 3. The electrodes (corresponding to the second electrode 23 in FIG. 3) are embedded in the second connection wiring layer 22 with one end face exposed from the second connection wiring layer 22, and connected to the CMOS image sensor 20 or the like via wiring inside the device layer 21, for example.

The bonding surfaces of the second substrate 2 and the first substrate 3 are polished and flattened, and after the bonding surfaces are subjected to activation treatment, they are directly bonded without using an adhesive. As a result, the second substrate 2 and the first substrate 3 are temporarily bonded by hydrogen bonding due to the intermolecular force between the first connection wiring layer 32 and the second connection wiring layer 22. After that, the second substrate 2 and the first substrate 3 are subjected to heat treatment under predetermined conditions. Thereby, the second substrate 2 and the first substrate 3 are permanently bonded by covalent bonding between the first connection wiring layer 32 and the second connection wiring layer 22.

Thus, in the semiconductor device 1, the electrode (corresponding to the second electrode 23 in FIG. 3) provided on the lower surface of the CMOS image sensor 20 provided on the second substrate 2 and the first electrode 33 provided on the upper surface of the first substrate 3 can be connected. Therefore, for example, according to the logic circuit provided in the first substrate 3, it is possible to read signals from directly below the CMOS image sensor 20, so it is possible to reduce the area occupied by the substrate.

Therefore, in the first embodiment, bonding the first substrate 3 and the second substrate 2 having a predetermined structure and subjecting them to heat treatment under predetermined conditions suppresses poor connection of the electrodes (the wirings) at the interface between the substrates to be bonded together and improves the yield. The details of the method of manufacturing such a semiconductor device will be described later, with reference to FIGS. 6 to 8.

Next, referring to FIG. 3, a cross-sectional structure of the semiconductor device 1 according to the first embodiment will be described. In FIG. 3, an area near the cross section of the joint portion between the second connection wiring layer 22 of the second substrate 2 and the first connection wiring layer 32 of the first substrate 3 is selectively illustrated.

For example, as shown in FIG. 3, the second connection wiring layer 22 of the second substrate 2 includes a silicon oxide layer 41, a SiCN film 42, and a silicon oxide layer 43 which are stacked in order from the device layer 21 (See FIG. 2) side. The silicon oxide layer 41, the SiCN film 42, and the silicon oxide layer 43 constitute a second insulating layer. The wires 26 connected to devices such as the CMOS image sensor 20 provided inside the device layer 21 (See FIG. 2) are provided inside the silicon oxide layer 41.

Furthermore, the second connection wiring layer 22 of the second substrate 2 includes a second electrode 23 penetrating through the SiCN film 42 and the silicon oxide film 44 inside.

That is, the second connection wiring layer 22 has second insulating layers 41, 42, and 43 in which the second trenches M2 are formed in the second surface 22a facing the first surface 32a, and a second electrode 23 provided in the second trench M2.

Furthermore, in the semiconductor device 1, in the case of a structure having a gap film such as a Co layer on the lower wiring layer 26, the SiCN film 42 of the second interlayer insulating films 42 and 43 becomes unnecessary and is configured to be omitted.

Furthermore, for example, as shown in FIG. 3, a second electrode 23 of the second connection wiring layer 22 includes a second barrier metal film 24 provided in the second trench M2 and containing Ti, and a second conductive film 25 provided in the second trench M2 via a second barrier metal film 24 and containing polycrystalline Cu. More specifically, the second conductive film 25 is a polycrystalline Cu film, and the second barrier metal film 24 is a Ti film.

It is noted that for example, as shown in FIG. 3, the second conductive film 25 is adjacent to the second barrier metal film 24. Also, in the example of FIG. 3, the second barrier metal film 24 is a single-layer Ti film, however, the second barrier metal film 24 may be a film in which a plurality of Ti films is laminated.

Furthermore, for example, as shown in FIG. 3, similar to the second connection wiring layer 22 of the second substrate 2, the first connection wiring layer 32 of the first substrate 3 includes a silicon oxide layer 45, a SiCN film 46, and a silicon oxide layer 47 which are stacked in order from the device layer 31 (See FIG. 2) side. The silicon oxide layer 45, the SiCN film 46, and the silicon oxide layer 47 constitute the first insulating layer. A wiring 36 connected to a device such as a logic circuit provided inside the device layer 31 (See FIG. 2) is provided inside the silicon oxide layer 45.

Furthermore, the first connection wiring layer 32 of the first substrate 3 is internally provided with a first electrode 33 penetrating the SiCN film 46 and the silicon oxide layer 47.

That is, the first connection wiring layer 32 has first insulating layers 45, 46, and 47 having first trenches M1 formed in the first surface 32a, and a first electrode 33 provided in the first trench M1.

For example, as shown in FIG. 3, a first electrode 33 of the first connection wiring layer 32 includes a first barrier metal film 34 provided in the first trench M1 and containing Ti, and a first conductive film 35 provided in the first trench M1 via a first barrier metal film 34 and containing polycrystalline Cu. More specifically, the first conductive film 35 is a polycrystalline Cu film, and the first barrier metal film 34 is a Ti film.

For example, as shown in FIG. 3, the first conductive film 35 is adjacent to the first barrier metal film 34. Also, in the example of FIG. 3, the first barrier metal film 34 is a single-layer Ti film. However, this first barrier metal film 34 may be a film in which a plurality of Ti films is laminated.

Then, A first connection wiring layer 32 and a second connection wiring layer 22 are bonded together, so that the first surface 32a and the second surface 22a of the first connection wiring layer 32 face each other and the first electrode 33 and the second electrode 32 are in contact with each other.

Furthermore, for example, as shown in FIGS. 3, Ti and O are present on the bonding surface X between the first electrode 33 and the second electrode 23. Then, as described later, by controlling the conditions including the temperature and time of the heat treatment at the time of lamination, on the bonding surface X, copper oxide such as CuO and $Cu_2O$ is replaced with titanium oxide such as $TiO_2$. Specifically, the bonding surface X between the first electrode 33 and the second electrode 23 is formed with a $TiO_2$ film Y having a resistance value much lower than that of copper oxide (CuO, $Cu_2O$).

Here, the configuration, conditions, etc. in the vicinity of the bonding surface X between the first electrode 33 and the second electrode 23, for improving the bonding yield of the semiconductor device 1 by reducing the connection resistance between the first electrode 33 and the second electrode 23, will be described.

For example, after polishing for flattening the bonding surface X (first surface 32a) of the first substrate 3 having the configuration as described above, Cu of the first conductive film 35 and O existing on the polished surface of the first conductive film 35 may react to form a copper oxide film such as CuO or $Cu_2O$ having a high resistance value. The presence of this copper oxide film on the bonding surface between the first conductive film 35 and the second conductive film 25 may increase the connection resistance. Furthermore, there is a possibility that the connection resistance increases due to deviation of the bonding position between the first conductive film 35 and the second conductive film 25 from the predetermined position. When the connection resistance increases in this manner, the yield of the semiconductor device 1 is reduced as a result.

Figure 4:
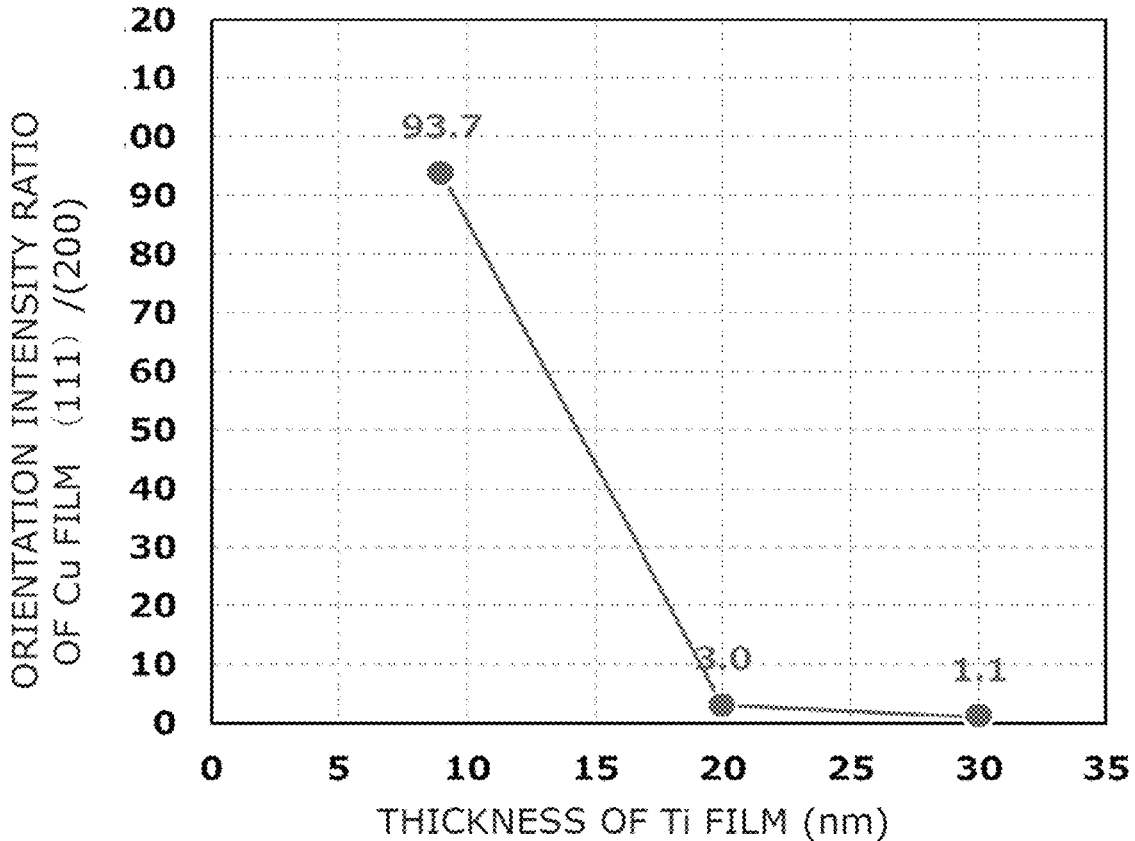
FIG. 4 is an explanatory diagram showing a relationship between a film thickness of a Ti film and an orientation intensity ratio of a Cu film.

Here, FIG. 4 is an explanatory diagram showing the relationship between the film thickness of the Ti film and the orientation strength of the Cu film. It is noted that the relationship between orientation strengths shown in FIG. 4 is based on data measured for a sample, a Cu film having a thickness of 800 nm is formed on a silicon oxide film formed on a silicon substrate through a barrier metal film which is a Ti film by an electrochemical plating ECP (Electro Chemical Plating) method, heat-treated at 150. degree.

As shown in this FIG. 4, the crystal orientation of the Cu film depends on the film thickness of the Ti film, which is the adjacent barrier metal film, as the thickness of the Ti film increases, the ratio of Cu (111) orientation to Cu (200) orientation decreases. In particular, in the example of FIG. 7, when the film thickness of the Ti film, which is the barrier metal film, is 18 nm or more, the ratio of the (111) orientation intensity to the (200) orientation intensity is considered to be 5.0 or less.

In general, the polycrystalline Cu film has a low coefficient of thermal expansion in the portion where the crystal orientation of Cu is (111) orientation, and on the other hand, a polycrystalline Cu film has a characteristic that the coefficient of thermal expansion is high in a portion where the crystal orientation of Cu is (200). Therefore, in order to accelerate the thermal expansion of the Cu film, it is considered effective to increase the thickness of the Ti film, which reduces the number of (111)—oriented planes in the film that is difficult to thermally expand.

Therefore, the first and second barrier metal films 34 and 24 made of Ti films adjacent to the first and second electrode films 35 and 25 which are Cu films of the first and second electrodes 33 and 23, are thickened (for example, 18 nm or more). As a result, in the first and second electrode films 35 and 25, which are polycrystalline Cu films, Cu (111) orientation, which has a low coefficient of thermal expansion, is suppressed, and the films can be made to have a film quality that facilitates thermal expansion.

Therefore, by appropriately controlling the film thickness of the Ti film that constitutes the barrier metal film, the thermal expansion coefficients of the first and second conductive films 35 and 25, which are polycrystalline Cu films, are increased, connectivity between the first electrode 35 and the second electrode 25 containing Cu as a main component is improved. That is, the bonding yield of the semiconductor device 1 can be improved.

Figure 5:
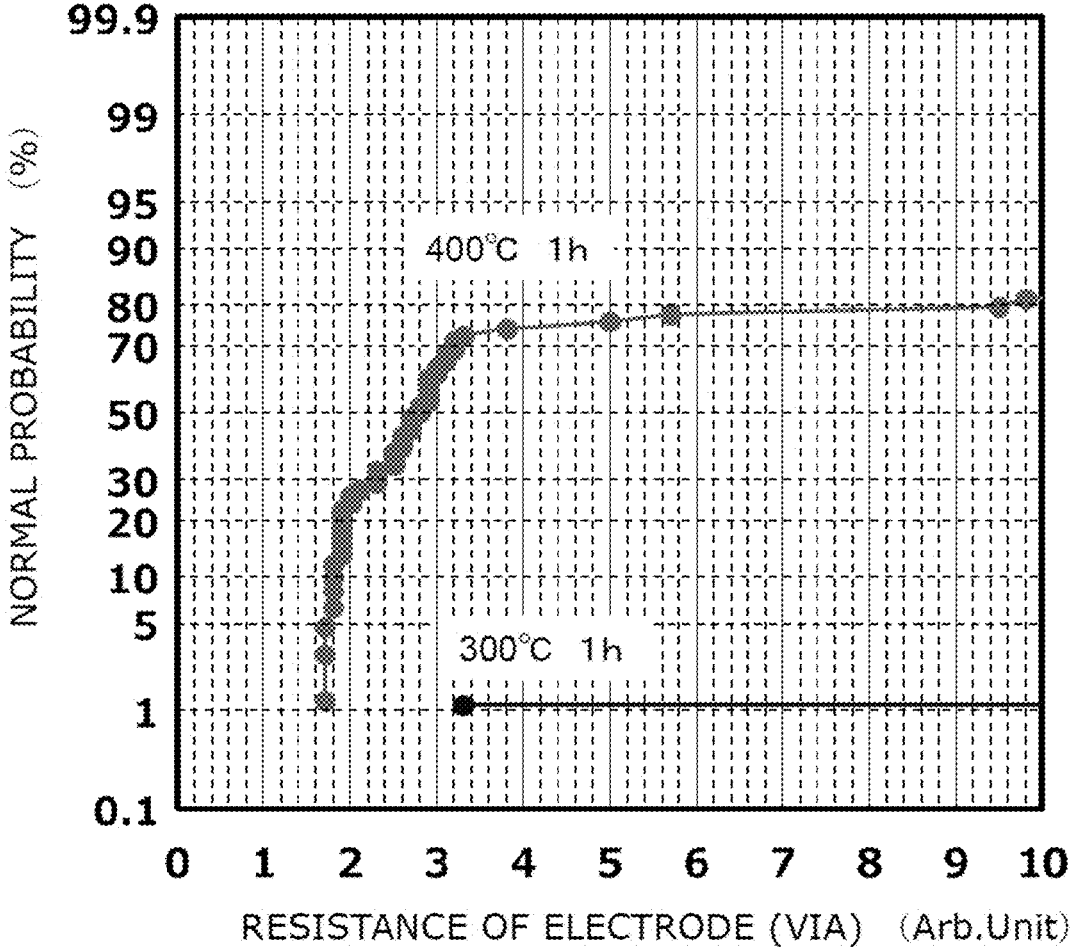
FIG. 5 is an explanatory diagram showing a relationship between via resistance values and Normal probability.

Next, FIG. 5 is an explanatory diagram showing a relationship between via resistance values and normal probability. It is noted that the relationship shown in FIG. 5 is based on data measured for samples, where a Cu film as a pad electrode is formed by an electrochemical plating method to a thickness of 1.25 μm on a silicon oxide film formed on a silicon substrate through a barrier metal film as a Ti film, subjected to heat treatment (annealing for bonding) at different temperatures during lamination, here 400° C. or 300° C. for 1 hour.

As shown in this FIG. 5, for example, the probability of via resistance of 4 or less is 70% or more when lamination annealing is performed at 400° C. for 1 hour, and on the other hand, when lamination annealing is performed at 300° C. for 1 hour, it becomes about 1%.

By appropriately controlling the temperature and time of lamination annealing in this way and utilizing the property that Ti in the barrier metal film thermally diffuses into the polycrystalline Cu film, it is considered that high-resistance copper oxide such as CuO and $Cu_2O$ can be replaced with low-resistance $TiO_2$ at the bonding interface of the pad electrode.

In other words, by bonding annealing, utilizing the property that Ti in the barrier metal film thermally diffuses into the polycrystalline Cu film, at the bonding interface between the first and second electrodes 33 and 23, high resistance CuO and $Cu_2O$ are replaced with low resistance titanium oxide such as $TiO_2$. Therefore, the first electrode 33 (first conductive film 35) of the first connection wiring layer 32 and the second electrode 23 (second conductive film 25) of the second connection wiring layer 22 are connected via the low resistance $TiO_2$ film Y. As a result, a resistance value between the first electrode 33 and the second electrode 23 can be lowered.

Therefore, in the semiconductor device 1 according to this embodiment, as shown in the above-mentioned FIG. 3, the bonding surface X between the first electrode 33 and the second electrode 23 is set so that Ti and O are present. Then, as will be described later, copper oxide is replaced with titanium oxide such as $TiO_2$ on the bonding surface X by controlling the conditions including the temperature and time of heat treatment during bonding. Specifically, a $TiO_2$ film Y having a resistance value much lower than that of copper oxide (CuO, $Cu_2O$) is formed on the bonding surface X between the first electrode 33 and the second electrode 23.

Thereby, the connection resistance between the first electrode 33 of the first connection wiring layer 32 and the second electrode 23 of the second connection wiring layer 22 can be reduced.

That is, the semiconductor device 1 can improve the yield by suppressing poor connection of the electrodes (wiring) at the bonding interface between the substrates to be bonded.

Method of Manufacturing Semiconductor Devices

Next, as described above, a method for manufacturing the semiconductor device 1 according to the first embodiment will be described with reference to FIGS. 6 to 8. FIGS. 6 to 8 are explanatory diagrams showing the manufacturing process of the semiconductor device 1 according to the first embodiment.

The manufacturing process of the device layer 21 of the second substrate 2 and the device layer 31 of the first substrate 3 is the same as those of a general semiconductor device. Also, the process of forming the second connection wiring layer 22 on the side of the second substrate 2 and the process of forming the first connection wiring layer 32 on the side of the first substrate 3 are similarly described.

For this reason, the process of forming the first connection wiring layer 32 on the side of the first substrate 3 and the process of bonding the second substrate 2 and the first substrate 3 will be explained here, and the descriptions of the manufacturing process of the device layers 21 and 31 and the forming process of the second connection wiring layer 22 of the second substrate 2 are omitted.

Figure 6A:
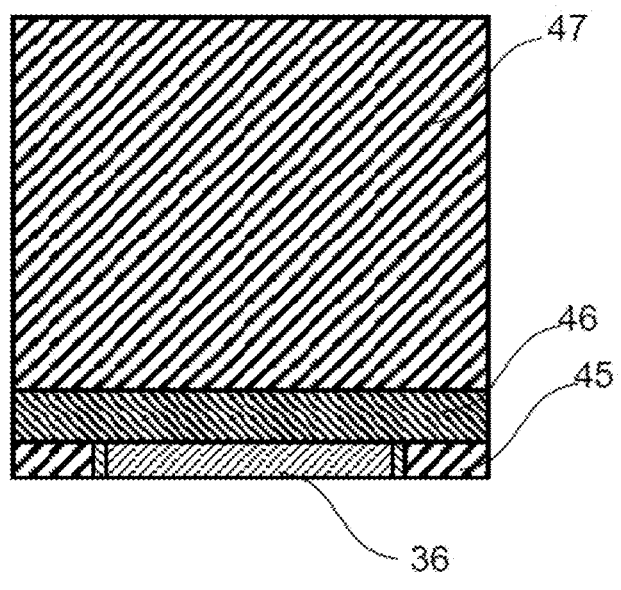
FIGS. 6A to 6C are explanatory diagrams showing a manufacturing process of the semiconductor device according to the first embodiment.

For example, when manufacturing the first substrate 3 shown in FIGS. 1 and 2, first, as shown in FIG. 6A, the silicon oxide layer 45 is formed on the surface of the device layer 31 by, for example, CVD (Chemical Vapor Deposition). Then, the wiring 36 is formed on the surface of the silicon oxide layer 45 by a damascene method.

Thereafter, for example, by sequentially stacking a SiCN film 46 and the silicon oxide layer 47 by CVD, the first insulating layer is formed on the silicon oxide layer 45 in which the wiring 36 is embedded (FIG. 6A).

Figure 6B:
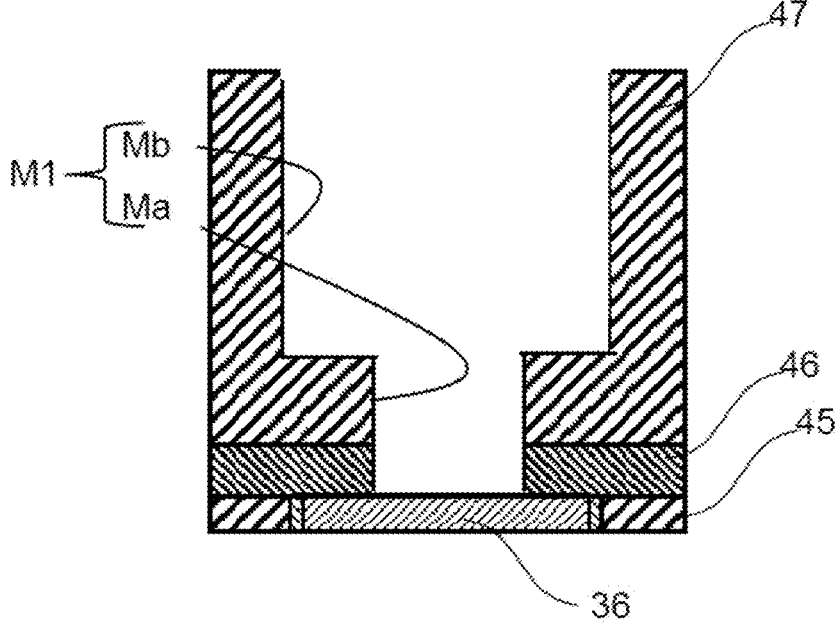

Subsequently, as shown in FIG. 6B, a first trench M1 having the same shape as the first electrode 33 is formed at the position where the first electrode 33 (see FIG. 3) is to be formed. In this step, first, a resist (not shown) is formed on the silicon oxide layer 47, and for example, an opening having a diameter smaller than the width of the wiring 36 is formed at the formation position of the first electrode 33 in the resist.

Then, a via hole Ma extending from the surface of the silicon oxide layer 47 to the surface of the wiring 36 is formed by performing RIE (Reactive Ion Etching) using a resist having openings as a mask.

After that, the diameter of the opening formed in the resist is expanded, for example, to the same extent as the width of the wiring 36, and RIE is performed again, a wiring or pad electrode groove Mb is formed from the surface of the silicon oxide film 47 to about the center of the silicon oxide layer 47 in the thickness direction so as to expand the diameter of the via hole Ma. As a result, the first grooves M1 having the shape shown in FIG. 6B are formed.

Figure 6C:
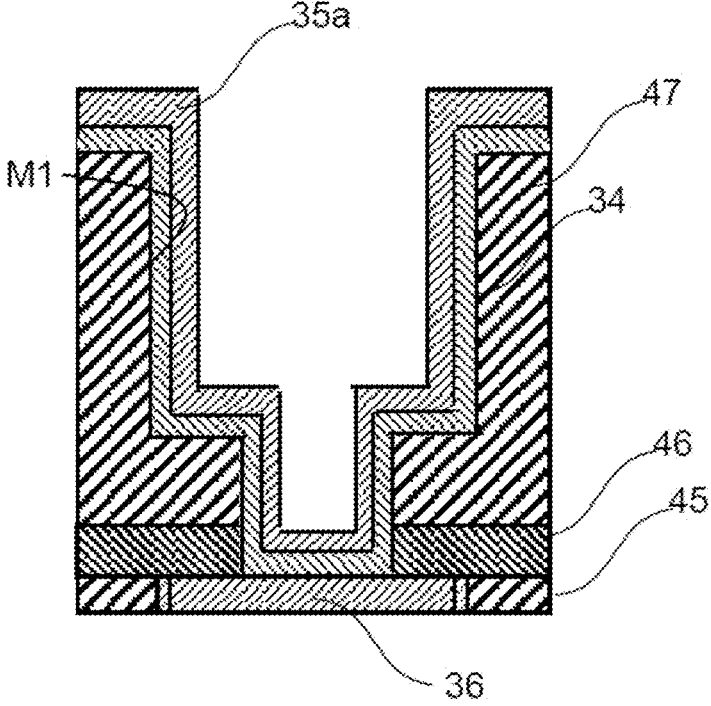

Then, as shown in FIG. 6C, by covering the inner peripheral surface of the first groove M1 and the surface of the silicon oxide layer 47 with a thin film of Ti, a first barrier metal film 34 containing Ti is formed. Furthermore, by forming a Cu film on the surface of the first barrier metal film 34 by, for example, PVD or sputtering, a seed film is formed (FIG. 6C). It is noted that when the first barrier metal film 34 has a laminated structure, preferably, the first barrier metal film 34 is formed in the same apparatus under continuous high vacuum.

Figure 7A:
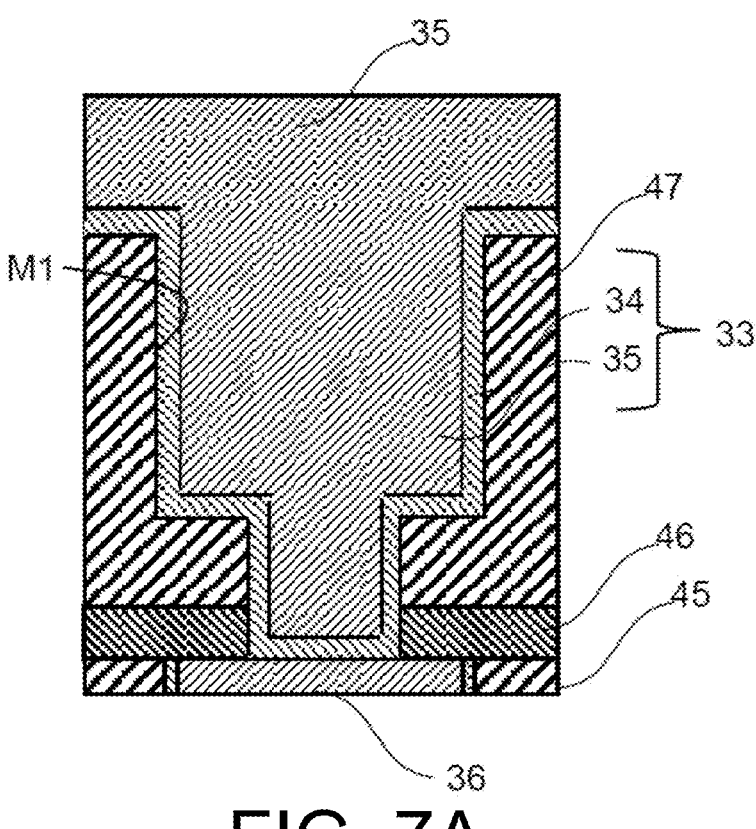
FIGS. 7A to 7C are an explanatory diagram showing the manufacturing process of the semiconductor device according to the first embodiment.
Figure 8:
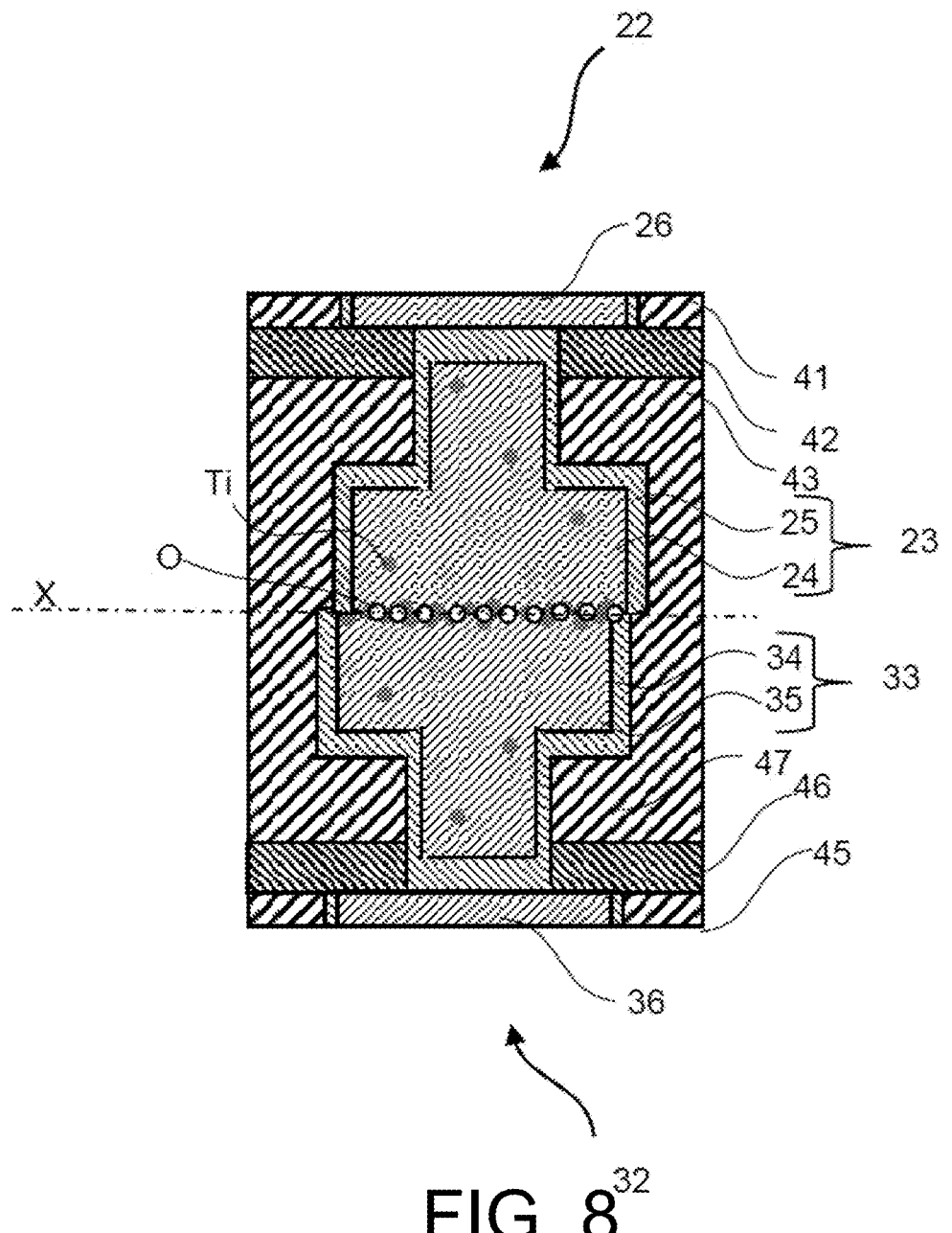
FIG. 8 is an explanatory diagram showing the manufacturing process of the semiconductor device according to the first embodiment.

After that, as shown in FIG. 7A, Cu is deposited on the surface of the seed film 35a shown in FIG. 6C, for example, by electroplating. Thus, a first conductive film 35 containing Cu is formed (FIG. 7A).

Figure 7B:
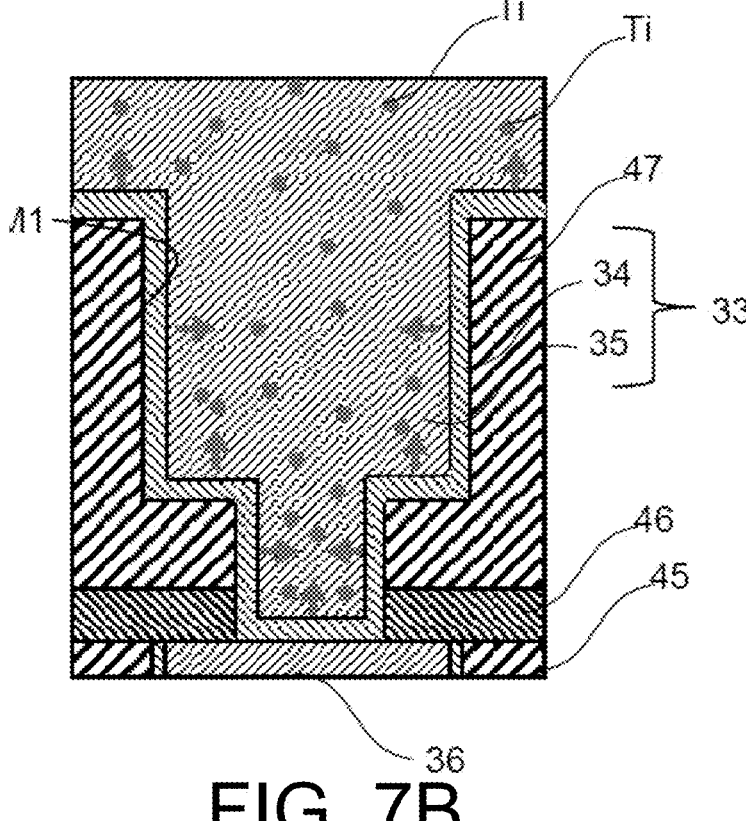

After that, as shown in FIG. 7B, after Cu is deposited, an annealing treatment is performed to diffuse the Ti atoms of the first barrier metal film 34 into the first conductive film 35 containing Cu.

In this way, the first electrode 33 is formed to include a first barrier metal film 34 provided in the first trench M1 and containing Ti, and a first conductive film 35 provided in the first trench M1 via a first barrier metal film 34 and containing polycrystalline Cu. Then, Ti of the first barrier metal film 34 is diffused into the first conductive film by the annealing treatment.

As mentioned above, the second substrate 2 is also processed in the same way, the second electrode 23 is formed to include a second barrier metal film 24 provided in the second trench M2 and containing Ti, and a second conductive film 25 provided in the second trench M2 via a second barrier metal film 24 and containing polycrystalline Cu. Then, Ti of the second barrier metal film 24 is diffused into the second conductive film 25 by the annealing treatment.

Also, as mentioned above, by increasing the film thickness of the first barrier metal film 35 containing Ti to a predetermined value (for example, 18 nm or more), in the first electrode film 35 which is a polycrystalline Cu film, Cu (111) orientation, which has a low coefficient of thermal expansion, is suppressed. As a result, the coefficient of thermal expansion of the first conductive film 35, which is a polycrystalline Cu film, is increased, and the connectivity of the first electrode 35, which is mainly composed of Cu, is improved.

Figure 7C:
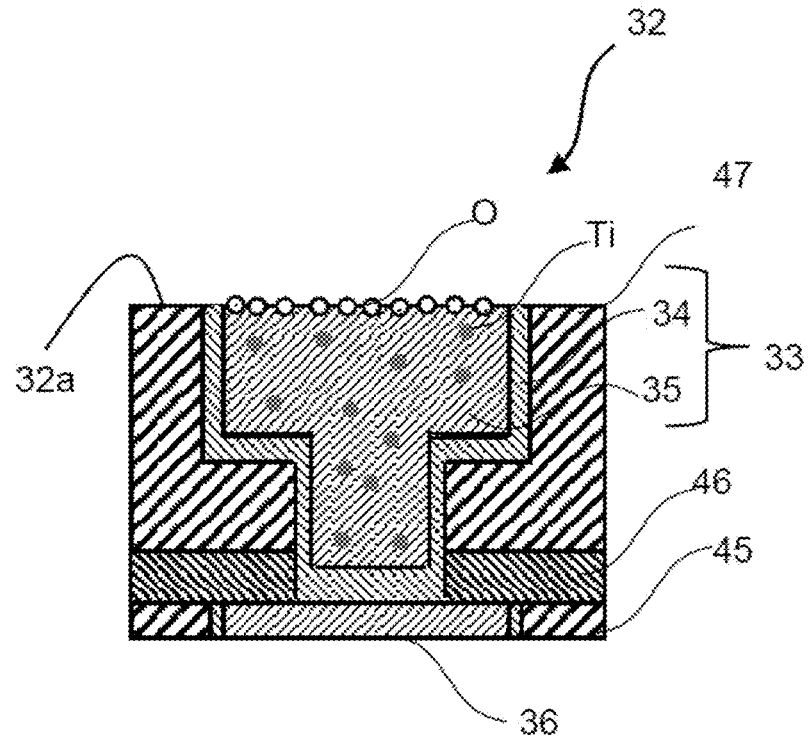

Subsequently, by polishing the surface of the first substrate 3 whose surface is coated with Cu, for example, by a CMP (Chemical Mechanical Polishing) method, as shown in FIG. 7C, the upper portion of the first barrier metal film 35 containing unnecessary Cu and Ti on the silicon oxide film 47 is removed.

Oxygen O exists on the first surface 32a of the first connection wiring layer 32 planarized by the CMP method, and a copper oxide film (not shown) such as CuO or $Cu_2O$ having a high resistance value is formed on the first surface. 32a (FIG. 7C).

In this way, a first connection wiring layer 32 that has first insulating layers 45, 46, and 47 having first trenches M1 formed in the first surface 32a, and a first electrode 33 provided in the first trench M1, is formed. In addition, as described above, in the same process for the second substrate 2, a second connection wiring layer 22 that has second insulating layers 41, 42, 43 having second trenches M2 formed in the second surface 22a, and a second electrode 23 provided in the second trench M2, is formed.

Then, as shown in FIG. 8, the second substrate 2 on which the second connection wiring layer 22 is formed and the first substrate 3 are bonded in the same manner as the first substrate 3. In this state, O of copper oxide (CuO, $Cu_2O$, etc.) exists on the bonding surface X between the first electrode 33 and the second electrode 23.

After that, by heat-treating the second substrate 2 and the first substrate 3, on the bonding surface X, copper oxide such as CuO and $Cu_2O$ is replaced with titanium oxide such as $TiO_2$. Specifically, by the heat treatment, a film Y (FIG. 3) containing $TiO_2$ having a very low resistance value is formed on the bonding surface X between the first electrode 33 and the second electrode 23.

Thus, the first connection wiring layer 32 and the second connection wiring layer 22 are bonded so that the first surface 32a faces the second surface 22a and the first electrode 33 and the second electrode 23 are in contact with each other. Furthermore, by performing heat treatment after bonding the first connection wiring layer 32 and the second connection wiring layer 22, as shown in FIG. 3, a film Y containing TiO₂ is formed on the bonding surface X between the first electrode 33 and the second electrode 23, and the semiconductor device 1 is completed.

As described above, in the semiconductor device 1 according to the first embodiment, it is possible to suppress poor connection of the electrodes (wiring) at the bonding interface between the substrates to be bonded, thereby improving the yield.

Here, in the above-described first embodiment, an example of the configuration in which the first and second electrodes 33, 23 of the first and second connection wiring layers 32, 22 are formed by the so-called dual damascene method has been described. However, the configuration of the first and second electrodes 33, 23 is not limited to this. Therefore, other examples of the configuration of the first and second electrodes 33 and 23 will be described in the following second to fifth embodiments.

Second Embodiment

Figure 9:
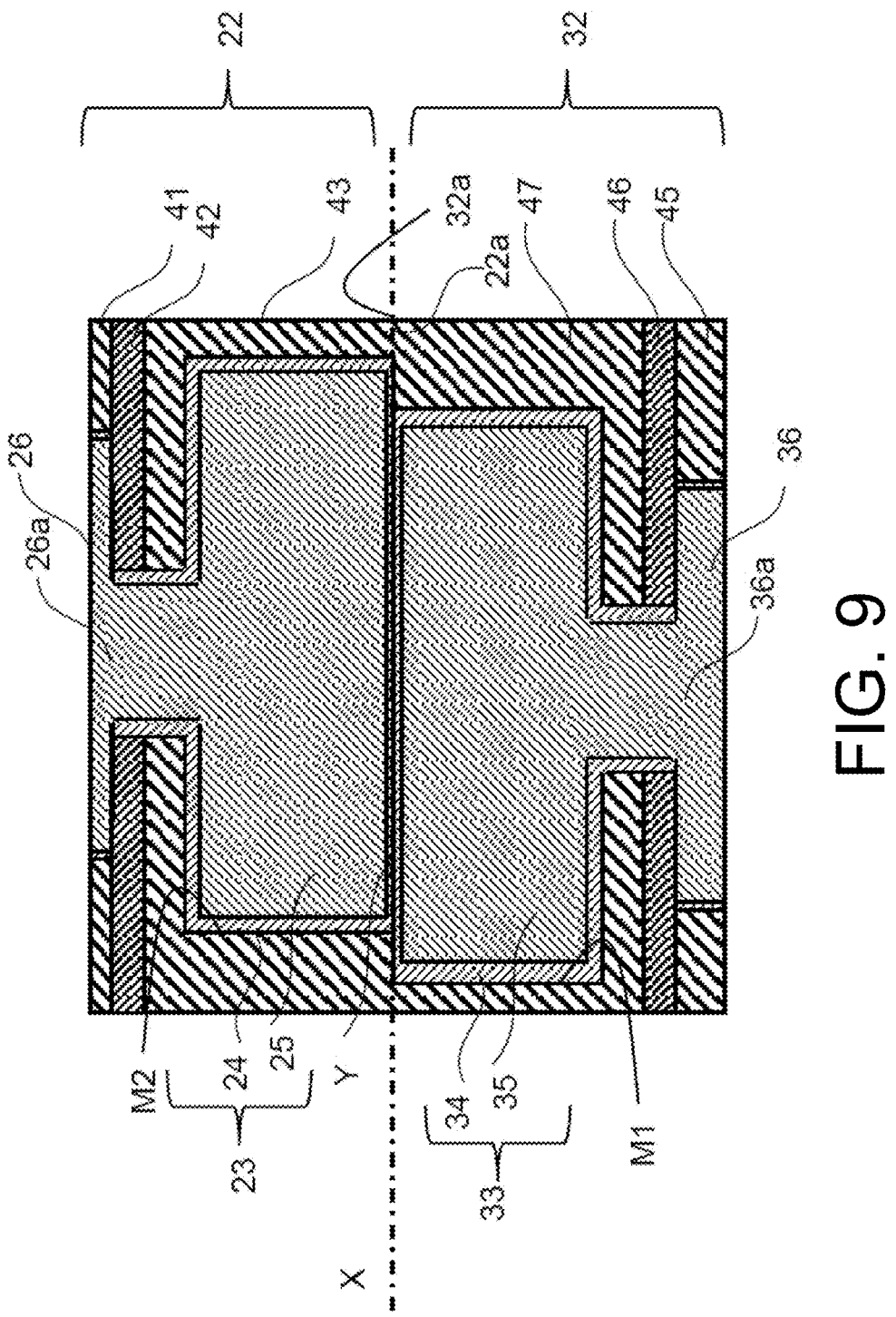
FIG. 9 is an explanatory diagram showing the cross-sectional structure of the semiconductor device according to a second embodiment.

Next, referring to FIG. 9, the semiconductor device according to the second embodiment will be described. FIG. 9 is an explanatory diagram showing the cross-sectional structure of the semiconductor device according to the second embodiment. In the following description, among the constituent elements shown in FIG. 9, the constituent elements that are the same as the constituent elements shown in FIG. 3 are given the same reference numerals as those shown in FIG. 3, and the explanation thereof is omitted. The overall configuration of the semiconductor device shown in FIG. 9 of the second embodiment is similar to that of the semiconductor device 1 shown in FIGS. 1 and 2 of the first embodiment, for example.

As shown in this FIG. 9, in the first connection wiring layer 32, an opening 36a is formed through the first barrier metal film 34 at the bottom of the first trench M1, the first conductive film 35 and the wiring 36 may be directly connected.

In the same way, as shown in FIG. 9, in the second connection wiring layer 22, an opening 26a is formed through the second barrier metal film 24 at the bottom of the second trench M2, the second conductive film 25 and the wiring 26 may be directly connected.

Other configurations of the semiconductor device of the second embodiment are the same as those of the semiconductor device 1 of the first embodiment.

That is, according to the semiconductor device according to the second embodiment, it is possible to suppress poor connection of the electrodes (wiring) at the bonding interface between the substrates to be bonded, thereby improving the yield.

Third Embodiment

Figure 10:
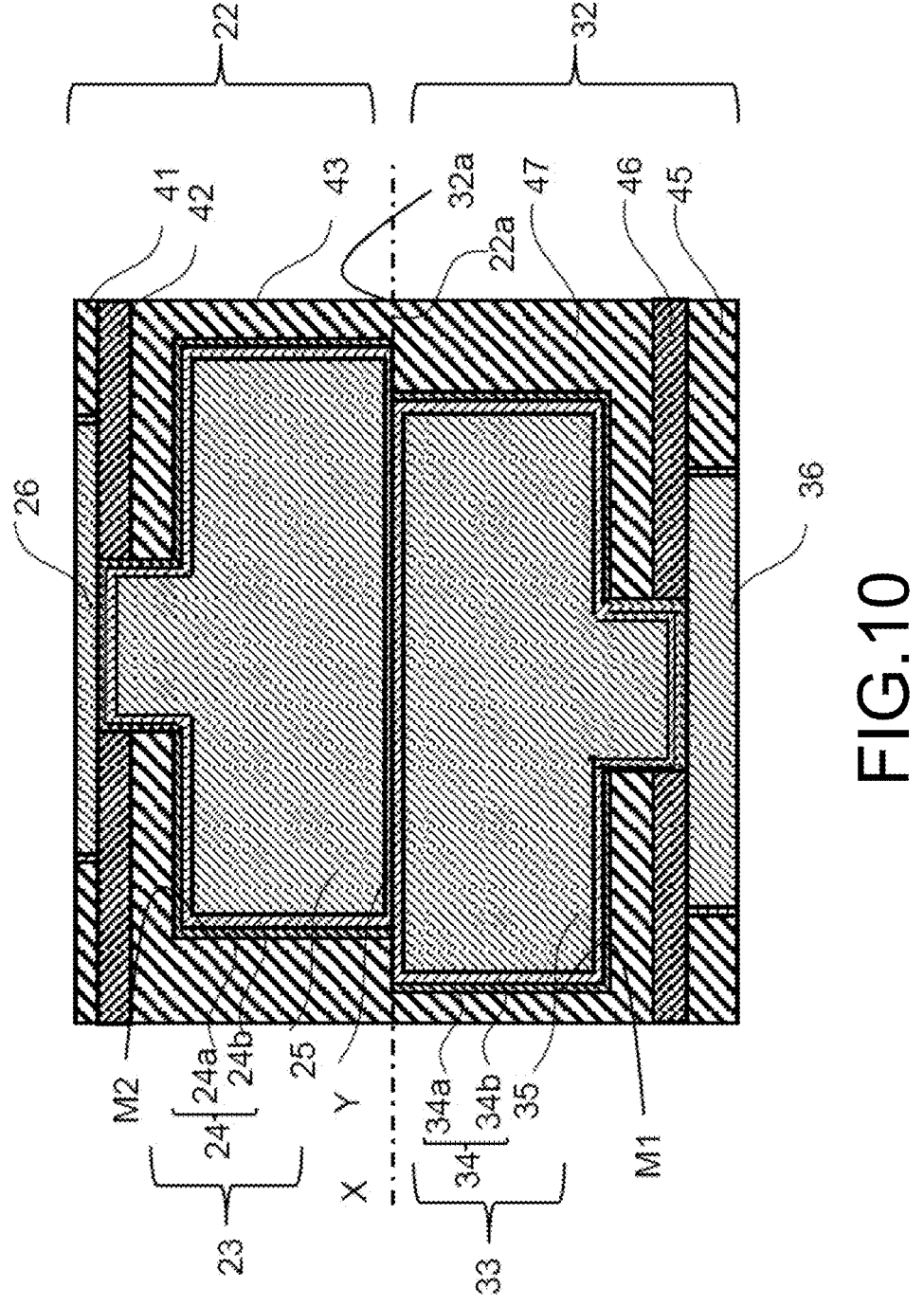
FIG. 10 is an explanatory diagram showing the cross-sectional structure of the semiconductor device according to a third embodiment.

Next, referring to FIG. 10, the semiconductor device according to the third embodiment will be described. FIG. 10 is an explanatory diagram showing the cross-sectional structure of the semiconductor device according to the third embodiment. In the following description, among the components shown in FIG. 10, the same components as those shown in FIG. 3 are denoted by the same reference numerals as those shown in FIG. 3, and the explanation thereof is omitted. The overall configuration of the semiconductor device shown in FIG. 10 of the third embodiment is similar to that of the semiconductor device 1 shown in FIGS. 1 and 2 of the first embodiment, for example.

As shown in this FIG. 10, in the first connection wiring layer 32, the first barrier metal film 34 may include a first Ta film 34a mainly composed of Ta formed in the first trench M1 and, a first Ti film 34b containing Ti as a main component and formed in the first trench M1 via the first Ta film 34a.

In the same way, as shown in FIG. 10, the second barrier metal film 24 may include a second Ta film 24a mainly composed of Ta formed in the second trench M2, and a second Ti film 24b containing Ti as a main component and formed in the second trench M2 via a second Ta film 24a.

Other configurations of the semiconductor device of the third embodiment are the same as those of the semiconductor device 1 of the first embodiment.

That is, according to the semiconductor device according to the third embodiment, it is possible to suppress poor connection of the electrodes (wiring) at the bonding interface between the substrates to be bonded, thereby improving the yield.

Fourth Embodiment

Figure 11:
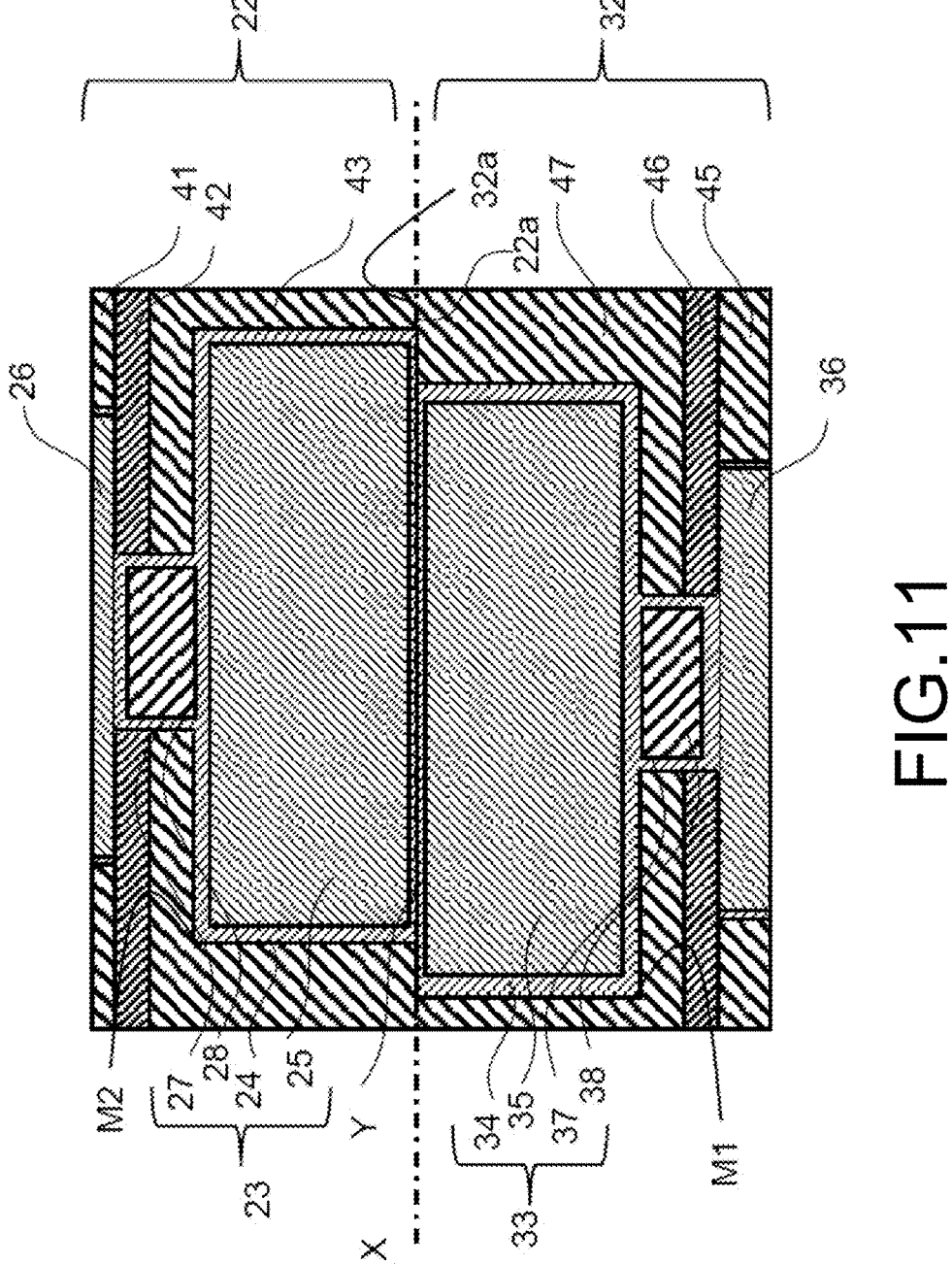
FIG. 11 is an explanatory diagram showing the cross-sectional structure of the semiconductor device according to a fourth embodiment.

Next, referring to FIG. 11, the semiconductor device according to the fourth embodiment will be described. FIG. 11 is an explanatory diagram showing the cross-sectional structure of the semiconductor device according to the fourth embodiment. In the following description, among the components shown in FIG. 11, the same components as those shown in FIG. 3 are denoted by the same reference numerals as those shown in FIG. 3, and the explanation thereof is omitted. The overall configuration of the semiconductor device shown in FIG. 11 of the fourth embodiment is similar to that of the semiconductor device 1 shown in FIGS. 1 and 2 of the first embodiment, for example.

As shown in this FIG. 11, in the first connection wiring layer 32, for example, after forming the first barrier metal film 37 mainly composed of Ti and the first conductive film 38 mainly composed of W by the single damascene method, the first barrier metal film 34 mainly composed of Ti and the first conductive film 35 mainly composed of Cu may be formed again by the single damascene method.

In the same way, as shown in this FIG. 11, in the second connection wiring layer 22, after forming the second barrier metal film 27 mainly composed of Ti and the second conductive film 28 mainly composed of W by the single damascene method, the second barrier metal film 24 mainly composed of Ti and the second conductive film 25 mainly composed of Cu may be formed again by the single damascene method.

Other configurations of the semiconductor device of the fourth embodiment are the same as those of the semiconductor device 1 of the first embodiment.

That is, according to the semiconductor device according to the fourth embodiment, it is possible to suppress poor connection of the electrodes (wiring) at the bonding interface between the substrates to be bonded, thereby improving the yield.

Fifth Embodiment

Figure 12:
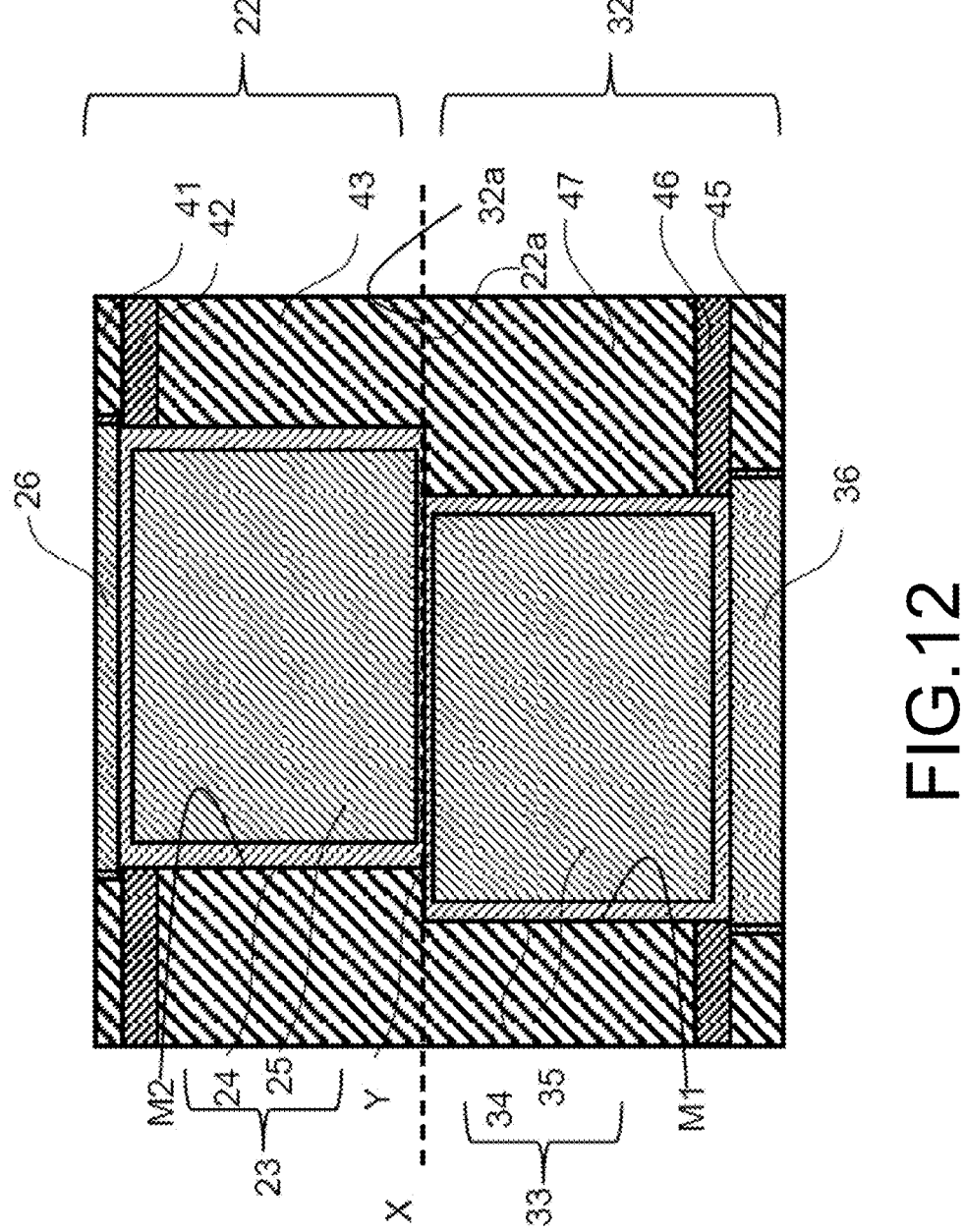
FIG. 12 is an explanatory diagram showing the cross-sectional structure of the semiconductor device according to a fifth embodiment.

Next, referring to FIG. 12, the semiconductor device according to the fifth embodiment will be described. FIG. 12 is an explanatory diagram showing the cross-sectional structure of the semiconductor device according to the fifth embodiment. In the following description, among the components shown in FIG. 12, the same components as those shown in FIG. 3 are denoted by the same reference numerals as those shown in FIG. 3, and the explanation thereof is omitted. The overall configuration of the semiconductor device shown in FIG. 12 of the fifth embodiment is similar to, for example, the semiconductor device 1 shown in FIGS. 1 and 2 of the first embodiment.

As shown in FIG. 12, in the first connection wiring layer 32, the first electrodes 33 may constitute via electrodes.

Similarly, as shown in FIG. 12, in the second connection wiring layer 22, the second electrodes 23 may constitute via electrodes.

As a result, the first electrode 33 and the second electrode 23, which are via electrodes, are connected through the film Y including the $TiO_2$ film.

Other configurations of the semiconductor device of the fifth embodiment are the same as those of the semiconductor device 1 of the first embodiment.

That is, according to the semiconductor device according to the fifth embodiment, it is possible to suppress poor connection of electrodes (wiring) at the bonding interface between substrates to be bonded together, thereby improving the yield.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first connection wiring layer configured to comprise a first insulating layer including a first trench formed on a first surface, and a first electrode provided in the first trench; and
a second connection wiring layer configured to comprise a second insulating layer including a second trench formed on a second surface facing the first surface, and a second electrode provided in the second trench,
wherein the first connection wiring layer and the second connection wiring layer are bonded such that the first surface and the second surface face each other and the first electrode and the second electrode are in contact with each other, wherein the first electrode includes a first barrier metal film provided in the first trench and containing Ti, and a first conductive film provided in the first trench via the first barrier metal film and containing polycrystalline Cu,
wherein the second electrode includes a second barrier metal film provided in the second trench and containing Ti, and a second conductive film provided in the second trench via the second barrier metal film and containing polycrystalline Cu,
wherein Ti and O are present on a bonding surface between the first electrode and the second electrode,
wherein Ti and O are present throughout on the bonding surface,
wherein the second connection wiring layer of a second substrate includes a first silicon oxide layer, a SiCN film, and a second silicon oxide layer which are stacked in order from a device layer of the second substrate,
wherein the first silicon oxide layer, the SiCN film, and the second silicon oxide layer constitute a second insulating layer,
wherein wires are connected to devices provided inside the device layer are provided inside the first silicon oxide layer,
wherein the first conductive film is a polycrystalline Cu film, and the first barrier metal film is a Ti film, and
wherein a film containing $TiO_2$ is formed on the bonding surface between the first electrode and the second electrode.

2. The semiconductor device according to claim 1, wherein the film containing TiO2 is formed on the bonding surface between the first electrode and the second electrode by the heat treatment.

3. The semiconductor device according to claim 1, wherein the first barrier metal film is a single-layer Ti film or a film in which multiple Ti films are laminated.

4. The semiconductor device according to claim 1, wherein the second barrier metal film is a single-layer Ti film or a film in which multiple Ti films are laminated.

5. The semiconductor device according to claim 3, wherein the second barrier metal film is a single-layer Ti film or a film in which multiple Ti films are laminated.

6. The semiconductor device according to claim 1, wherein the first conductive film is adjacent to the first barrier metal film.

7. The semiconductor device according to claim 1, wherein the second conductive film is adjacent to the second barrier metal film.

8. The semiconductor device according to claim 6, wherein the second conductive film is adjacent to the second barrier metal film.

* * * * *